United States Patent
Brenner et al.

(10) Patent No.: US 6,410,125 B1
(45) Date of Patent: Jun. 25, 2002

(54) WEAR-RESISTANT, MECHANICALLY HIGHLY STRESSED AND LOW-FRICTION BOUNDARY COATING CONSTRUCTION FOR TITANIUM OR THE ALLOYS THEREOF AND A METHOD FOR PRODUCING THE SAME

(75) Inventors: Berndt Brenner, Pappritz; Steffen Bonss, Zella-Mehlis; Hans-Joachim Scheibe, Dresden; Holger Ziegele, München, all of (DE)

(73) Assignee: Fraunhofer-Gesellschaft zur Forderung der Angewandten Forschung e.v., Munich (DE)

( * ) Notice: Subject to any disclaimer, the term of this patent is extended or adjusted under 35 U.S.C. 154(b) by 0 days.

(21) Appl. No.: 09/530,963
(22) PCT Filed: Nov. 10, 1998
(86) PCT No.: PCT/DE98/03367
§ 371 (c)(1), (2), (4) Date: Jul. 24, 2000
(87) PCT Pub. No.: WO99/27147
PCT Pub. Date: Jun. 3, 1999

(30) Foreign Application Priority Data

Nov. 19, 1997 (DE) .......................... 197 51 337

(51) Int. Cl.⁷ ............................ B32B 5/00; C23C 26/00
(52) U.S. Cl. .................... 428/216; 427/457; 427/470; 427/532; 427/534; 427/540; 427/577; 428/212; 428/336; 428/408; 428/457
(58) Field of Search .................... 428/336, 408, 428/216, 457, 212; 427/457, 470, 532, 534, 540, 577

(56) References Cited

U.S. PATENT DOCUMENTS

| 4,902,535 A | 2/1990 | Garg et al. |
| 5,009,966 A | 4/1991 | Garg et al. |
| 5,290,368 A | 3/1994 | Gavigan et al. |

(List continued on next page.)

FOREIGN PATENT DOCUMENTS

| DE | 3917211 | 11/1990 |
| DE | 19637450 | 1/1998 |
| EP | 0322812 | 7/1989 |

(List continued on next page.)

OTHER PUBLICATIONS

Bergmann, "Thermochemische Behandlung von Titan und Titanlegierungen durch Laserumschmelzen und Gaslegieren", Zeitschrift für Werkstofftech, vol. 16, pp. 392 to 405 (1985). No Month.

*Primary Examiner*—Archene Turner
(74) *Attorney, Agent, or Firm*—Greenblum & Bernstein, P.L.C.

(57) ABSTRACT

The invention relates to a wear-resistant, highly stressed and low-friction boundary coating construction for titanium or the alloys thereof which can be advantageously used in order to protect human implants. According to the inventive boundary coating construction the boundary coating is comprised of a 200 to 400 nm thick DLC coating (4), a 5 to 50 nm thick intermediate coating (3) and a 0.3 to 2.0 mm thick gas alloyed coating (2), said gas alloyed coating having a hardness between 600 $HV_{0.1}$ and 1,400 $HV_{0.1}$. The inventive boundary coating construction is produced by firstly melting the surface of the member which is to be protected. The surface is then gas alloyed and cleaned in an $N_2/Ar$ atmosphere. Subsequently, the intermediate coating is first deposited followed by a depositing of the hard amorphous carbon coating by means of the laser-induced, pulsed vacuum arc (laser-arc) method.

16 Claims, 2 Drawing Sheets

U.S. PATENT DOCUMENTS

| | | | |
|---|---|---|---|
| 5,326,362 A | | 7/1994 | Shetty et al. |
| 5,366,345 A | | 11/1994 | Gerdes et al. |
| 5,593,719 A | * | 1/1997 | Dearnaley et al. .......... 427/527 |
| 5,925,422 A | * | 7/1999 | Vandenbulcke et al. .... 427/577 |
| 6,126,793 A | * | 10/2000 | Sugiyama et al. .......... 427/531 |
| 6,231,956 B1 | * | 5/2001 | Brenner et al. ............. 428/408 |

FOREIGN PATENT DOCUMENTS

| | | |
|---|---|---|
| EP | 0401488 | 12/1990 |
| EP | 0491075 | 6/1992 |
| GB | 2282149 | 3/1995 |

* cited by examiner

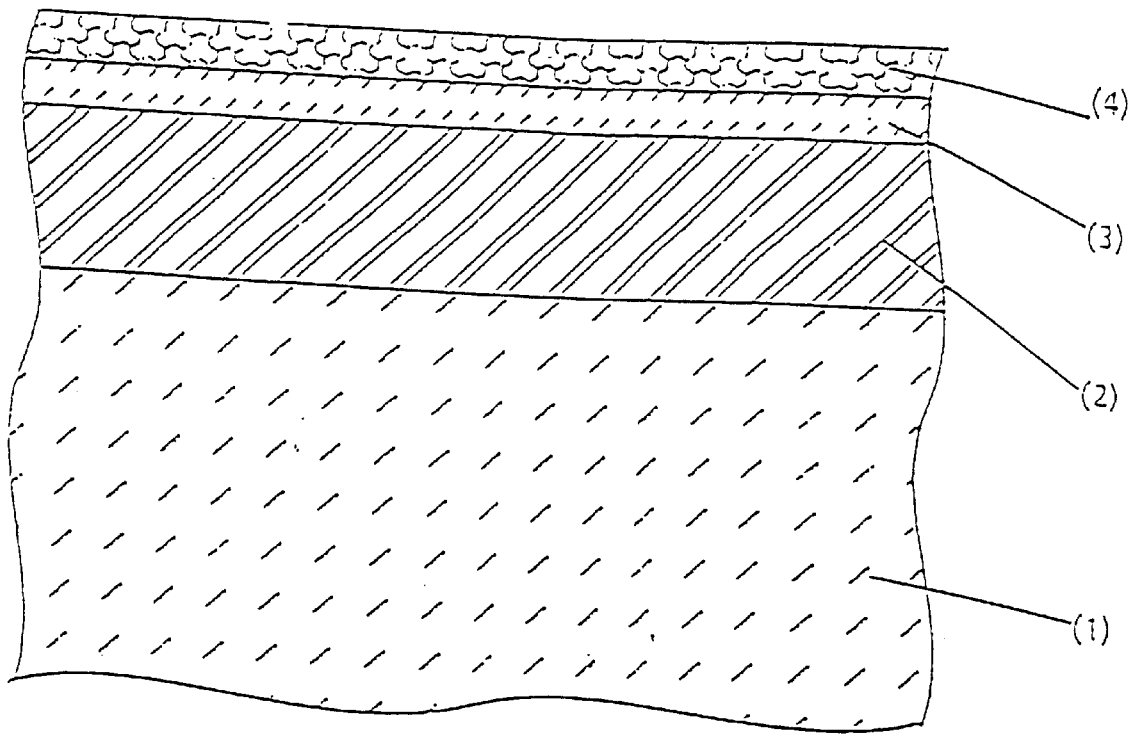
Figure 1: Boundary coating construction according to the invention

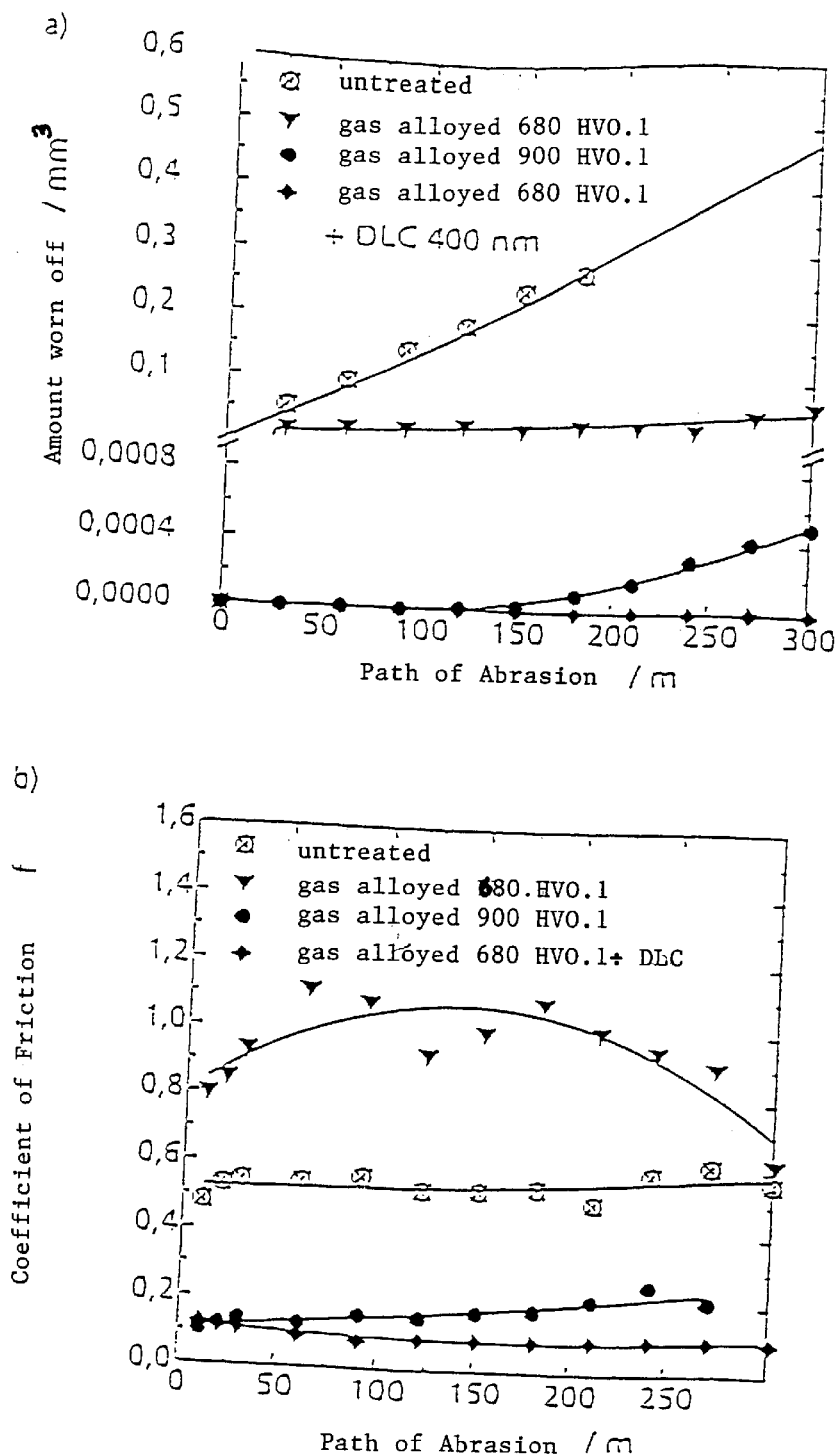
Figure 2: Wear resistance and frictional behavior of the layers produced according to the invention as compared to layers that correspond to prior art (DLC = hard amorphous carbon layer)

WEAR-RESISTANT, MECHANICALLY HIGHLY STRESSED AND LOW-FRICTION BOUNDARY COATING CONSTRUCTION FOR TITANIUM OR THE ALLOYS THEREOF AND A METHOD FOR PRODUCING THE SAME

BACKGROUND OF THE INVENTION

1. Field of the Invention

The invention relates to the boundary layer refinement of functional components. Objects for which the use thereof is possible and suitable are all functional components composed of titanium or alloys thereof subjected to sliding wear that are loaded at use temperatures less than 500° C., are subjected to a high surface pressure, and must have as low a coefficient of friction as possible. The invention is especially advantageous for protecting human implants, in particular with oscillating movement cycles, as well as components from the air and space flight sector that are subjected to sliding wear.

2. Discussion of Background Information

Titanium is an excellent construction material whose high specific strength, chemical stability, and biocompatibility make it especially appropriate for various specialized applications. However, its low resistance to sliding wear and its high coefficient of friction often prevent it from having a broader range of uses.

It is known to produce very wear-resistant boundary layers on titanium by means of laser gas alloying (see, e.g., H. W. Bergmann: "Thermochemische Behandlung von Titan und Titanlegierungen durch Laserumschmelzen und Gaslegieren," Zeitschrift fur Werkstofftechnik 16 (1985), p. 392 405).

DE 3,917,211 teaches that it is known to use laser gas alloying to protect joint endoprothesis. For this purpose, the component is melted by the laser beam up to a depth of 0.1 to 0.7 mm and, at the same time, nitrogen is blown into the melt. Because of the high affinity of the titanium to reactive gases, a titanium nitride forms immediately which precipitates out of the melt in the form of needles. After solidification, the boundary layer consists of a metallic matrix of titanium with a different $\alpha/\beta$ share in relation to the initial state as well as very thickly embedded titanium nitride needles, some of which are quite coarse. The hardness of the boundary layer is normally up to 1000 HV.

However, the deficiency of such layers consists in the fact that they have a large coefficient of friction and furthermore leave severe abrasion on the most commonly used opposing bodies. The cause of this deficiency is that the very hard titanium nitride needles project from the surface after the initial wear period. The local stress of the tribosystem is increased thereby until furrowing of the opposing body and, at the same time, microscopic interlockings of the titanium nitride needles and the opposing body are caused, which increase the coefficient of friction.

A further deficiency of these layers occurs during loading in an oxygenated atmosphere and preferably at higher temperatures, and expresses itself in the fact that catastrophic failures of the friction pairing can occur, especially under conditions of insufficient lubrication. The cause of this consists in that the metallic matrix between the TiN needles has a high affinity for oxygen.

In order to be able to avoid the negative effects of the TiN needles, in particular for the field of human implants, U.S. Pat. No. 5,326,362 teaches a gas nitriding process in which molecular nitrogen is diffused into the regions near the surface at a process temperature of 400° C. to 704.4° C. and forms a wear-resistant boundary layer by means of a solution hardening. For this purpose, the component is placed in a vacuum oven, evacuated at a pressure of $1 \cdot 10^{-6}$ Torr, subsequently replenished with 1 at of nitrogen, heated to 537.7° C., the nitrogen pressure increased to 2 at, and nitrided for several hours at 593.3° C. After the end of the treatment, the boundary layer consists of a 0.2 $\mu$m thick connecting layer of titanium nitrides, titanium carbon nitrides, titanium oxides and titanium carbooxides, and a diffusion layer that is a few $\mu$m thick. The titanium nitrides located in the connective layer are significantly more finely dispersed than in laser gas alloying. Because the connective layer forms a closed layer on the surface, the loading capability of the layer in an oxygenated atmosphere and at increased temperatures is simultaneously increased thereby.

However, the deficiencies of this process consist of the fact that the coefficient of sliding friction is not sufficiently reduced and that the wear resistance at high contact pressures is not sufficient. The cause for these deficiencies results from the fact that, on the one hand, the connective layer still consists of very hard and not completely even titanium nitride needles that cause furrows in the opposing body and, on the other hand, the diffusion layer lying thereunder is too thin to be able to withstand a high local loading for a sufficiently long period of time. The latter primarily results from the fact that, in Hertzian stresses with the contact surfaces that arise in practice, the stress maximum lies under the layer. In soft base material, plastic deformations can therefore arise that cause stripping of the brittle connective layer.

SUMMARY OF THE INVENTION

The present invention provides a boundary coating construction that is biocompatible and substantially more resistant to sliding wear having a very low sliding friction coefficient for titanium and the alloys thereof and a method for producing the same.

The present invention provides a boundary coating construction that, while using the high wear resistance of titanium nitride, has a hardness depth that is at least one order of magnitude greater and that has no titanium nitride needles directly in the surface.

The present invention uses a wear-resistant, mechanically heavy duty, and lowfriction boundary layer construction for titanium or alloys thereof, consisting of a laser gas alloyed layer with deposited titanium nitride needles.

The present invention relates to a substrate of titanium and alloys thereof having a wear resistant, heavy-duty, and low-friction boundary construction, which is made of a laser gas alloyed layer having deposited titanium nitride needles. The boundary layer comprises an outer hard amorphous carbon layer having a thickness from 200 to 400 nm, an intermediate layer having a thickness of from 5 to 50 nm and an inner laser gas alloyed layer having a thickness from 0.3 to 2.0 mm wherein the gas alloyed layer has a hardness between 600 HV0.1 and 1400 HV0.1.

It is preferred that the substrate of titanium and alloys thereof has a final roughness of less than 0.1 $\mu$m before any layer deposition and that the intermediate layer has a thickness from about 5 to 20 nm.

The intermediate layer is preferably titanium.

In the solving the problem according to the present invention, an extremely thin intermediate layer is of particular significance, in particular, because of very short process times for economic reasons and because at the low thicknesses of the intermediate layer especially high adhesive strengths of the hard amorphous carbon layer can be obtained. The intermediate layer can have a thickness of 5 to 50 nm. If the final roughness of the titanium substrate before the thin intermediate layer deposition is less than 0.1 μm, the intermediate layer can preferably have a thickness between 5 to 20 nm.

A preferred embodiment of the present invention is when the substrate of titanium and alloys thereof has a final roughness of less than 0.1 μm before any layer deposition and the intermediate layer has a thickness from about 5 to 20 nm, thus providing a particularly good adhesion of the hard-amorphous carbon layer is achieved.

The present invention also provides a method for producing a boundary layer construction with low coefficients of friction and a very high load bearing ability. According to the invention, the method comprises:

melting a component surface to be protected in the form of tracks with a high-power laser, at an oxygen partial pressure of <5 ppm and in a reactive atmosphere comprising $N_2$ and Ar, with a relative nitrogen content between 40% and 80%, thereby providing a degree of overlapping Ü;

sanding the melted component to a surface roughness of at least $\leq 0.2$ μm;

cleaning the component in a high vacuum device by means of ion bombardment;

applying an intermediate layer using a laser-controlled, pulsed vacuum arc; and applying with the laser-controlled, pulsed vacuum arc a hard amorphous carbon layer to the component.

The degree of overlapping Ü is expressed in a ratio and is determined by the formula: $(a-c)/a$, where a is the track width, and c is the track distance. The degree of overlapping Ü is $0.5 \leq Ü \leq 0.9$. The high-power produces a laser beam having an output thickness p where p is $1 \times 10^4$ W/cm$^2 \leq p \leq 2 \times 10^5$ W/cm$^2$.

The invention shall be described in further detail using the following exemplary embodiment.

BRIEF DESCRIPTION OF THE DRAWINGS

The present invention is described in the following drawings:

FIG. 1 shows a boundary coating construction according to the present invention. Element 1 is a substrate made of titanium and alloys thereof. Element 2 is a gas alloyed layer comprising titanium nitride needles embedded in a titanium matrix. Element 3 is a titanium intermediate layer. Element 4 is the hard amorphous carbon layer.

FIG. 2a shows the improvement in wear resistance of the layers produced according to the present invention as compared to untreated layers of the prior art.

FIG. 2b shows the frictional behavior of the layers produced according to the present invention as compared to untreated layers of the prior art.

EXAMPLE 1

A component made of the alloy Ti6A14V with the dimensions 10×40×60 mm$^3$ is to be provided on a flat side with a very wear-resistant and low-friction layer construction.

For this purpose, the component, which has been ground and cleaned of grease deposits with a solvent, is positioned on the workbench of a CNC machine. A special protective glass dome is located above the component, into which an $N_2$—Ar mixture that has been mixed in a gas mixing station at a ratio of $N_2$: Ar=60: 40 or $N_2$: Ar=70: 30 is blown under pressure. The protective dome is constructed in such a way that it is freely movable in three coordinate directions and guarantees a residual oxygen content of $\leq 3$ ppm after a purge cycle of only 90 s. The laser output is 5 kW, the beam has a diameter of 3.4 mm on the component, the rate of speed is selected as 8 mm/min. The track distance is 0.75 mm at a resulting track width of 4.5 mm. This results in a degree of overlapping of 83.3%. After an oxygen partial pressure of <5 ppm has been reached, the process of gas alloying is started by starting the CNC program and releasing the laser. The layer produced in this manner is 1.2 mm deep, consists of titanium nitride needles embedded in a titanium matrix.

After cooling the component, its surface is sanded with a diamond-bound abrasive disc with a graining of 125 μm until a uniform surface with a roughness of $\leq 0.62$ μm has been achieved. Sanding with SiC paper P800 to P1200 follows thereafter until a roughness of $\leq 0.12$ μm has been achieved.

The surface of the component is subsequently cleaned in a vacuum chamber by means of ion bombardment with argon ions. In the same chamber is located an arrangement for performing the laser-controlled, pulsed vacuum arc (laser arc) process for producing the hard amorphous carbon layers. The arrangement consists of a pulsed vacuum arc, the target material, which is connected as a cathode, as well as a Q-switched Nd-Yag laser with a power density of $>5 \cdot 10^8$ W/cm$^2$. The component is mounted in a substrate holder.

The roll-shaped cathode has two parts and consists of one titanium and one graphite roll.

A voltage is applied between the cathode and anode that is not yet sufficient for igniting an arc discharge. The laser is focused on the titanium roll and switched on. Its pulses create plasma clouds, each of which ignites a brief arc discharge. Ti ions and atoms are deposited onto the substrate. After the desired layer thickness for the intermediate layer has been reached, the arc is switched to the graphite cathode and the hard amorphous carbon layer is applied to the component. The deposited layer is 400 nm thick and consists of a hard amorphous carbon film.

In order to determine the wear resistance, the components are tested on a ball-on-disc tribometer whose ball is composed of hard metal.

The ball has a diameter of 3 mm and is pressed onto the test sample with a force of 2.5 N. The experiment is performed under atmospheric conditions at room temperature and without lubricant. The amount worn off is measured with a profilometer. For this purpose, the experiment is interrupted after each 30 m of wear path. The total wear path is 300 m.

FIG. 2a shows the comparison of the amounts worn off of untreated titanium alloys, various laser gas alloyed layers according to prior art, and the layer construction according to the invention. It is clear that the tests with the layer construction according to the invention display a decidedly better wear behavior. FIG. 2b shows the influence of the boundary layer refinement method on the coefficients of friction of the same treatment variants. It is apparent here as well that the layer construction according to the invention is decidedly better than the known methods.

EXAMPLE 2

With an analogous experimental model and analogous experimental method to that in Example 1, a curved component made of the alloy Ti6A14V with the dimensions 6×40×16 mm³ is to be provided with a very wear-resistant and low-friction layer construction on its curved outer side.

In contrast to Example 1, however, after the second sanding step in Example 2, a polishing process is performed up to a final roughness of <0.10 µm.

The performance of the layering method (deposition of the intermediate layer and deposition of the hard amorphous carbon layer-DLC-layer) occurs analogously to Example 1.

After the deposition is completed, a 10 nm thick Ti intermediate layer and, immediately adjacent thereto, a 300 nm thick, hard amorphous carbon layer (DLC-layer) is measured on the coated, curved component.

Furthermore, a coefficient of friction of 0.1 and a wear depth of 50 nm were measured for the wear-resistant layer by means of an oscillating abrasion tribometer using the following experimental characteristics:

use of a ball of 100 Cr6 with a diameter of 10 mm stroke length 0.2 mm load 10 N oscillation frequency f=20 Hz measurement after 100,000 cycles.

What is claimed is:

1. A wear resistant, heavy-duty, and low-friction boundary construction for titanium and alloys thereof made of a laser gas alloyed layer having deposited titanium needles, wherein the boundary construction comprises an outer hard amorphous carbon layer having a thickness from 200 to 400 nm, an intermediate layer having a thickness of from 5 to 50 nm, and an inner laser gas alloyed layer having a thickness from 0.3 to 2.0 mm wherein the gas alloyed layer has a hardness between 600 HV0.1 and 1400 HV0.1.

2. The boundary construction according to claim 1, wherein the inner laser gas alloyed layer has a final roughness of <0.10 µm before the intermediate layer is deposited and the intermediate layer has a thickness ranging from about 5 to 20 nm.

3. The boundary construction according to claim 1, wherein the intermediate layer comprises titanium.

4. The boundary construction according to claim 2, wherein the intermediate layer comprises titanium.

5. A method of producing a wear resistant, heavy-duty, and low-friction boundary construction for a surface of titanium and alloys thereof comprising:

melting the surface of the titanium and alloys thereof to be protected in the form of tracks with a high-power laser at an oxygen partial pressure of <5 ppm and in a reactive atmosphere comprising $N_2$ and Ar, thereby providing a degree of overlapping $\ddot{U}$;

cooling the surface;

sanding the cooled surface to a surface roughness of $\leqq 0.2$ µm;

cleaning the surface in a high vacuum device by ion bombardment;

applying an intermediate layer using a laser-controlled, pulsed vacuum arc; and applying with the laser-controlled, pulsed vacuum arc an outer hard amorphous carbon layer upon the intermediate layer.

6. The method according to claim 5 wherein the reactive atmosphere comprises $N_2$ and Ar, with a relative nitrogen content between 40% and 80%.

7. The method according to claim 6 wherein the reactive atmosphere comprises $N_2$ and Ar, with a relative nitrogen content of about 60%.

8. The method according to claim 6 wherein the reactive atmosphere comprises $N_2$ and Ar, with a relative nitrogen content of about 70%.

9. The method according to claim 5 wherein the surface is cleaned in a high vacuum device by ion bombardment with Ar ions.

10. The method according to claim 5 wherein the outer hard amorphous carbon layer has a thickness from 200 to 400 nm.

11. The method according to claim 5 wherein the intermediate layer comprises titanium.

12. The method according to claim 11 wherein the intermediate titanium layer has a thickness from 5 to 50 nm.

13. The method according to claim 5 wherein the inner laser gas alloyed layer has a thickness from 0.3 to 2.0 mm.

14. The method according to claim 5 wherein the degree of overlapping $\ddot{U}$ is $0.5 \leqq \ddot{U} \leqq 0.9$.

15. The method according to claim 5 wherein the high-power laser produces a laser beam having an output thickness p where p is $1 \times 10^4 \text{ W/cm}^2 \leqq p \leqq 2 \times 10^5 \text{ W/cm}^2$.

16. The method according to claim 5 wherein the cooled surface is sanded to a surface roughness of $\leqq 0.1$ µm.

* * * * *